United States Patent
Li et al.

(10) Patent No.: US 12,365,814 B2
(45) Date of Patent: Jul. 22, 2025

(54) CHEMICAL MECHANICAL POLISHING SOLUTION

(71) Applicant: ANJI MICROELECTRONICS (SHANGHAI) CO., LTD, Shanghai (CN)

(72) Inventors: Shoutian Li, Shanghai (CN); Xiaoming Ren, Shanghai (CN); Changzheng Jia, Shanghai (CN)

(73) Assignee: ANJI MICROELCTRONICS (SHANGHAI) CO., LTD, Shanghai (CN)

( * ) Notice: Subject to any disclaimer, the term of this patent is extended or adjusted under 35 U.S.C. 154(b) by 245 days.

(21) Appl. No.: 17/784,094

(22) PCT Filed: Dec. 3, 2020

(86) PCT No.: PCT/CN2020/133603
§ 371 (c)(1),
(2) Date: Jun. 9, 2022

(87) PCT Pub. No.: WO2021/121044
PCT Pub. Date: Jun. 24, 2021

(65) Prior Publication Data
US 2023/0026568 A1    Jan. 26, 2023

(30) Foreign Application Priority Data

Dec. 19, 2019 (CN) .......................... 201911320536.0

(51) Int. Cl.
| | |
|---|---|
| C09G 1/02 | (2006.01) |
| B24B 1/00 | (2006.01) |
| B24B 37/04 | (2012.01) |
| C09G 1/00 | (2006.01) |
| C09G 1/04 | (2006.01) |
| C09G 1/06 | (2006.01) |
| C09K 3/14 | (2006.01) |
| C09K 13/06 | (2006.01) |
| H01L 21/306 | (2006.01) |
| H01L 21/3105 | (2006.01) |
| H01L 21/321 | (2006.01) |

(52) U.S. Cl.
CPC .................. *C09G 1/02* (2013.01); *B24B 1/00* (2013.01); *B24B 37/044* (2013.01); *C09G 1/00* (2013.01); *C09G 1/04* (2013.01); *C09G 1/06* (2013.01); *C09K 3/1454* (2013.01); *C09K 3/1463* (2013.01); *C09K 13/06* (2013.01); *H01L 21/30625* (2013.01); *H01L 21/3105* (2013.01); *H01L 21/321* (2013.01); *H01L 21/3212* (2013.01); *C09K 3/1409* (2013.01)

(58) Field of Classification Search
None
See application file for complete search history.

(56) References Cited

U.S. PATENT DOCUMENTS

| | | | |
|---|---|---|---|
| 2004/0152309 A1* | 8/2004 | Carter | .................... C03C 19/00 |
| | | | 438/689 |
| 2010/0029181 A1* | 2/2010 | De Rege Thesauro | ..................... |
| | | | H01L 21/3212 |
| | | | 451/37 |

FOREIGN PATENT DOCUMENTS

| | | |
|---|---|---|
| CN | 102952466 A | 3/2013 |
| CN | 103666276 A | 3/2014 |
| CN | 108026412 A | 5/2018 |
| CN | 109251677 A | 1/2019 |
| CN | 110520493 A | 11/2019 |

OTHER PUBLICATIONS

First Office Action for CN Appl. No. 20191320536.0 issued May 10, 2023, 6 pages.
Second Office Action for CN Appl. No. 20191320536.0 issued Nov. 8, 2023, 3 pages.

* cited by examiner

*Primary Examiner* — Jiong-Ping Lu
(74) *Attorney, Agent, or Firm* — Dentons US LLP

(57) ABSTRACT

Disclosed is a chemical mechanical polishing solution containing water, cerium oxide abrasive particles and hydroxylamine, which can also increase the removal rate of patterned silicon dioxide with further addition of 4-hydroxybenzoic acid or salicylhydroxamic acid.

4 Claims, No Drawings

CHEMICAL MECHANICAL POLISHING SOLUTION

CROSS-REFERENCE TO PRIOR APPLICATIONS

This application is a National Stage of PCT/CN2020/133603, filed Dec. 3, 2020 and published Jun. 24, 2021 as WO 2021/121044 A1, which claims priority to Chinese Patent Application No. 201911320536.0, filed Dec. 19, 2019, each hereby expressly incorporated by reference in its entirety.

TECHNICAL FIELD

The present invention relates to a chemical mechanical polishing solution, in particular to one chemical mechanical polishing solution.

BACKGROUND

Currently, chemical mechanical polishing (CMP) has become the most effective and mature planarization technology in the process of manufacturing micro-nano devices. In the process of manufacturing micro-nano devices, the technology of Interlayer Dielectric-ILD (Interlayer Dielectric-ILD) has become the mainstream isolation technology because of its outstanding performance of isolation, plat surface topography and good locking performance. The role of CMP in the formation of ILD structure is to planarize a stepped oxide layer, and its main polishing performance parameters include polishing rate and planarization efficiency. To improve the polishing rate of dielectric materials, it is generally more effective to use cerium oxide as polishing particles, but a high polishing rate often leads to overpolishing, i.e., a high Trench Loss on patterned silicon wafer, resulting in a low planarization efficiency. Polishing solutions with the function of auto-stop is generally adopted in the CMP process. The so-called function of auto-stop means that the blanks have a lower polishing rate and the patterned silicon wafers keep a higher polishing rate. It can keep a high polishing rate at a higher step height, and inhibit the polishing rate at a lower step height, thus achieving the function of auto-stop. The function of auto stop or self-stopping indicates that the polishing rate is related to the step height, with usually 2000 Å/min when the step is high at 2000 Å, and a decrease from 2000 Å/min to below 400 Å/min when the step is close to 0 Å. For the polishing solution without the function of auto stop, the polishing rate has little relationship with the step height. Generally, the polishing rate change will not be more than 1.5 times the speed of blanks. It is noteworthy that if the polishing rates of blanks and patterned silicon wafers are both either high or low, the function of auto stop function is absent. Once the polishing solution has the function of auto stop, without the need to design a great thickness for the dielectric layer in the process of wafer designing, nor invest in polishing end point detection devices, we can reduce the silicon wafer trench loss, improving the overall efficiency of the process of planarization.

Therefore, there is a need to find a more effective chemical mechanical polishing solution with the function of auto stop in its true sense.

DESCRIPTION

The invention aims at balancing the polishing rate and planarization efficiency of dielectric materials when the chemical mechanical polishing solution planarizes a stepped oxide layer, which cannot be achieved in the prior art.

The invention provides a chemical mechanical polishing solution including cerium oxide abrasive particles, hydroxylamine ($NH_2OH$) and water.

Further, the concentration of the cerium oxide abrasive particles is 0.01 wt %-2 wt %.

Further, the concentration of hydroxylamine is 0.002 wt %-0.4 wt %.

Further, the chemical mechanical polishing solution further includes a pH regulator, wherein the pH regulator is ammonia water, potassium hydroxide or nitric acid, sulfuric acid and acetic acid.

Further, the pH of the chemical mechanical polishing solution ranges from 3 to 6.

Further, the chemical mechanical polishing solution further includes 4-hydroxybenzoic acid.

Further, the concentration of the 4-hydroxybenzoic acid is 0.002 wt %-0.2 wt %.

Further, the chemical mechanical polishing solution further includes salicylhydroxamic acid.

Further, the concentration of salicylhydroxamic acid is wt %-0.2 wt %.

In the present invention, ppm refers to the mass concentration expressed with the parts per million of solute mass to total solution mass, which is called ppm concentration. The wt % and the percentage of each component are mass percentage concentrations.

The reagents and raw materials used in the invention are commercially available.

The present invention has the following positive and progressive effects:

(1) To provide a chemical mechanical polishing solution with the function of auto stop in its true sense, which has a lower polishing rate on a blank wafer and a higher polishing rate on a patterned silicon wafer, and can keep a high polishing rate at a high step height. The lower becomes the step height, the better is the polishing rate inhibited, increasingly;

(2) To provide a chemical mechanical polishing solution with low solid content (the solid content of cerium oxide), in which the content of cerium oxide is 0.01 wt %-2 wt %, while that in the prior art is generally 2 wt %-6 wt %;

(3) The polishing methods adopting the chemical mechanical polishing solution in the application can achieve the reduction of silicon wafer trench loss without the need to use polishing end point detection devices, and have the advantages of simplified steps, high polishing rates and efficient planarization

EMBODIMENTS

The advantages of an embodiment of the invention will be explained in detail with reference to the following drawing and embodiments.

Embodiment 1

In this embodiment, the reference embodiment is 1 wt % sol-type cerium oxide, while in other embodiments and comparative embodiments a certain amount of compounds and cerium oxide is added to or deducted from the reference embodiment (refer to Table 1), with pH value being adjusted to 4.5 by adding ammonia water ($NH_4OH$) or nitric acid ($HNO_3$), and mass percentage being complemented to 100% with water.

Polishing method: The polishing machine Mirra is used to polish TEOS (silicon oxide) blank wafer (hereinafter referred to as "TEOS blank"). The corresponding polishing conditions include: IC1010 polishing pad, polishing disk (Platten) and polishing head (Carrier) with rotating speed being set at 93 rpm and 87 rpm, respectively, pressure set at 3 psi, flow rate of polishing solution set at 150 mL/min, and polishing time set at 60 seconds. TEOS film thickness is measured by using NanoSpec nonmetal film thickness measuring instrument (NanoSpec6100-300) at 49 points with equal intervals on the diameter line, starting from the 3 mm away from the edge of the wafer. The polishing rate is the average value of these 49 points.

TABLE 1

Proportion of Comparative Embodiment and Embodiment and Their Comparison of Polishing Effect on Blanks

| Polishing solution | Cerium dioxide (wt %) | Additive (wt %) | Concentration of the additive (wt %) | pH | TEOS blanks polishing rate @ 3 Psi (Å/min) |
|---|---|---|---|---|---|
| 1A (comparative embodiment) | 1 wt % | None | — | 4.5 | 6,020 |
| 1B (comparative embodiment) | 0.40 wt % | None | — | 4.5 | 4,105 |
| 1C (comparative embodiment) | 0.40 wt % | 4-hydroxybenzoic acid | 0.016 wt % | 4.5 | 3,922 |
| 1D (comparative embodiment) | 0.40 wt % | 4-hydroxybenzoic acid | 0.10 wt % | 4.5 | 3,744 |
| 1E (embodiment) | 1 wt % | hydroxylamine | 0.04 wt % | 4.5 | 313 |
| 1F (embodiment) | 1 wt % | hydroxylamine | 0.40 wt % | 4.5 | 260 |
| 1G (embodiment) | 1 wt % | hydroxylamine | 0.40 wt % | 5.5 | 278 |

Comparative embodiments 1C and 1D are obtained by adding 4-hydroxybenzoic acid to comparative embodiment 1B in Table 1. Through the comparison of the TEOS blank polishing rates of comparative embodiments 1C and 1D, it can be seen that with the increase of the content of 4-hydroxybenzoic acid, the lower becomes the TEOS blank polishing rate, the better becomes the inhibition. However, compared with the TEOS blank polishing rate of comparative embodiment 1B, the inhibition effect in comparative embodiments 1C and 1D is not very significant, which is only reduced from 4,105 Å/min to 3,922 Å/min and 3,744 Å/min, respectively. Therefore, the chemical mechanical polishing solution obtained from cerium oxide with 4-hydroxybenzoic acid cannot achieve low TEOS blank polishing rates, so it definitely does not have the function of auto stop function.

Embodiments 1E-1G are obtained by adding hydroxylamine to comparative embodiment 1A in Table 1. Through the comparison of comparative embodiment 1A, embodiments 1E and 1F, it can be seen that as the concentration of hydroxylamine concentration increases, the inhibition of TEOS blank polishing rate becomes increasingly better, and the overall inhibition is significant, with the TEOS blank polishing rate being reduced from 6,020 Å/min to 313 Å/min and 260 Å/min, respectively.

As seen from comparative embodiments 1F and 1G, as the pH value increases, the inhibition of TEOS blank polishing rate decreases instead. Specifically, when pH=4.5, TEOS blank polishing rate decreases from 6020 Å/min to 260 Å/min; when pH=4.5, the TEOS blank polishing rate i.e., the polishing rate of a step height of 0 decreases from 6,020 Å/min to 278 278 Å/min. Therefore, the chemical mechanical polishing solution prepared by cerium oxide with hydroxylamine can significantly inhibit the TEOS blank polishing rate. The lower is the step height, the better is the inhibition of polishing rate. Therefore, it is in accordance with one of the necessary conditions for function of auto stop. However, since it is necessary for the chemical mechanical polishing solution with the function of auto stop to simultaneously meet two conditions, one is to maintain a lower step height for better inhibition of the polishing rate, and the other is to keep a high polishing rate at a high step height. It is necessary to perform further verification of the high polishing rate on the patterned silicon wafer (with high step height), so as to verify that it really has the function of auto stop.

Embodiment 2

In this embodiment, the reference embodiment is 0.3 wt % sol-type cerium oxide, while in other embodiments and comparative embodiments a certain amount of compounds and cerium oxide is added to the reference embodiment (refer to Table 2), with pH value being adjusted to 4.5 by adding ammonia water ($NH_4OH$) or nitric acid (HNO3), and mass percentage being complemented to 100% with water.

Polishing method: The polishing machine Mirra is used to polish TEOS blank and patterned wafer. The corresponding polishing conditions include: IC1010 polishing pad, polishing disk (Platten) and polishing head (Carrier) with rotating speed set at 93 rpm and 87 rpm respectively, pressure set at 3 psi, and flow rate of polishing solution set at 150 mL/min. The TEOS film thickness is measured by using NanoSpec film thickness measuring system (NanoSpec6100-300, Shanghai Nanospec Technology Corporation) at 49 points with equal intervals on the diameter line, starting from the 3 mm away from the edge of the wafer. The polishing rate is the average value of these 49 points. The step height of the patterned wafer is measured by using a probe profiler (Bruker Nano's DETKAK XTL) when the bump line width/pit width is 30 um/70 um. Table 2 shows the polishing results of blank wafers and patterned wafers with different formulas when the polishing pressure is set at 3 Psi

TABLE 2

Proportion of Comparative Embodiments and Embodiment and Their Comparison of Polishing Effect

| Polishing solution | Cerium dioxide (wt %) | Additive 1 (wt %) | Additive 2 (wt %) | pH | TEOS speed @ 3 psi (Å/min) | Bump polishing rate @ 3 Psi (Å/min) | Bump/blank ratio |
|---|---|---|---|---|---|---|---|
| 2A (comparative embodiment) | 0.3 wt % | None | None | 4.5 | 4,162 | Not measured | None |
| 2B (comparative embodiment) | 0.3 wt % | pyridine-2,6-dicarboxylic Acid (0.01 wt %) | None | 4.5 | 67 | 88 | 1.3 |
| 2C (comparative embodiment) | 0.3 wt % | Hydroxylamine (0.01 wt %) | Polyether amine (0.0036 wt %) | 4.5 | 40 | 16 | 0.4 |
| 2D (embodiment) | 0.3 wt % | Hydroxylamine (0.01 wt %) | None | 4.5 | 258 | 1,424 | 5.5 |
| 2E (embodiment) | 0.3 wt % | Hydroxylamine (0.01 wt %) | 4-hydroxybenzoic acid (0.01 wt %) | 4.5 | 195 | 2,448 | 12.6 |
| 2F (embodiment) | 1.3 wt % | Hydroxylamine (0.01 wt %) | 4-hydroxybenzoic acid (0.04 wt %) | 4.5 | 164 | 1,176 | 8.1 |
| 2G (embodiment) | 0.3 wt % | Hydroxylamine (0.01 wt %) | Salicylhydroxamic acid (0.03 wt %) | 4.5 | 97 | 2,192 | 22.6 |

Compared with the comparative embodiment 2A, the comparative embodiment 2B shows that the polishing solution containing pyridine-2, 6-dicarboxylic acid can inhibit the TEOS blank polishing rate, but it does not have the function of auto stop. Therefore, the chemical mechanical polishing solution in comparative embodiment 2B does not have the function of auto stop.

In comparative embodiments 2B and 2C, the polishing rates of the chemical mechanical polishing solution containing pyridine-2,6-dicarboxylic acid and that containing hydroxylamine and polyether amine are inhibited on both blank and patterned silicon wafers. However, the function of auto stop requires a lower polishing rate on the blank wafer and a higher polishing rate on the patterned silicon wafer. Therefore, the chemical mechanical polishing solutions of comparative embodiments 2B and 2C do not have the function of auto stop.

Comparative embodiment 2D in Table 2 shows that the chemical mechanical polishing solution with hydroxylamine as an additive can achieve the function of auto stop. For example, in embodiment 2D (containing cerium oxide and hydroxylamine only) in this invention, on the blanks it can achieve a polishing rate of 258 Å/min, while on the patterned wafer it can achieve a polishing rate of 1,424 Å/min, which is 5.5 times that on the blanks, thus proving the function of auto stop.

In addition, through the comparison of the experiment results of embodiments 2E and 2G against those of embodiment 2D, it is discovered that 4-hydroxybenzoic acid or salicylhydroxamic acid can produce a synergistic effect with hydroxylamine. That is, on the basis that embodiment 2D has a high polishing rate of patterned silicon wafers and a low polishing rate of blanks, the polishing rate of patterned silicon wafers can be further increased and meanwhile the removal rate of blanks can be reduced. For example, with the addition of 0.01 wt % salicylhydroxamic acid to embodiment 2G, the polishing rate ratio can be increased from 5.5 in embodiment 2D to 22.6. Therefore, the chemical mechanical polishing solution containing salicylhydroxamic acid and hydroxylamine has the function of auto stop. In embodiment 2E, with the addition of 0.01 wt % 4-hydroxybenzoic acid to the polishing solution containing 0.3 wt % cerium oxide solid content and 0.01 wt % hydroxylamine content, the polishing rate ratio of patterned wafer to blank can be increased from 5.5 to 12.6. The chemical mechanical polishing solution containing 4-hydroxybenzoic acid and hydroxylamine has the function of auto stop. In addition, as seen from embodiments 2E and 2F, when the concentration of hydroxylamine and 4-hydroxybenzoic acid is kept constant, the effect of the function of auto stop will be weakened as the content of cerium oxide increases. Compared with embodiment 2E, the polishing rate ratio of patterned wafer to blank is reduced from 12.6 in embodiment 2E to 8.1 in embodiment 2F.

In conclusion, the chemical mechanical polishing solution containing cerium oxide and hydroxylamine has the function of auto stop. In addition, 4-hydroxybenzoic acid or salicylhydroxamic acid can produce synergistic effect with hydroxylamine. That is, the polishing rate of patterned wafer can be increased, and meanwhile the polishing rate of blank can be reduced, further enhancing the effect of the function of auto stop. However, the increase of cerium oxide content (for example, increase by >1.0 wt %) will weaken the effect of the function of auto stop.

Embodiment 3

In this embodiment, the reference embodiment is 0.3 wt % of sol-type cerium oxide, while in other embodiments a certain amount of compound is added to the reference embodiment and the content of sol-type cerium oxide is changed (refer to Table 2), with pH value being adjusted to 4.5 by adding ammonia water ($NH_4OH$) or nitric acid ($HNO3$), and mass percentage being complemented to 100% with water.

Polishing method: The polishing machine Mirra is used to polish TEOS blank and patterned wafer. The corresponding polishing conditions include: IC1010 polishing pad, polishing disk (Platten) and polishing head (Carrier) with rotating speed set at 93 rpm and 87 rpm respectively, pressure set at 3 psi, and flow rate of polishing solution set at 150 mL/min. TEOS film thickness is measured by using NanoSpec film thickness measuring system (NanoSpec6100-300, Shanghai Nanospec Technology Corporation) at 49 points with equal intervals on the diameter line, starting from 3 mm away from the edge of the wafer. The polishing rate is the average value of these 49 points. The step height of the patterned wafer is measured by using a probe profiler (Bruker Nano's DETKAK XTL) at the bump line width/pit width of 30 um/70 um. Table 2 shows the polishing results of blank wafers and patterned wafers with different formulas when the polishing pressure is set at 3 Psi.

TABLE 3

Proportion of Embodiments and Their Comparison of Polishing Effect

| Polishing solution | Cerium oxide (wt %) | Additive 1 (wt %) | Additive 2 (wt %) | pH | TEOS rate @ 3 Psi (Å/min) | Bump polishing rate @ 3 Psi (Å/min) | Bump/blank ratio |
|---|---|---|---|---|---|---|---|
| 3A (embodiment) | 0.3 wt % | Hydroxylamine (0.02 wt %) | 4-hydroxybenzoic acid (0.02 wt %) | 4.5 | 129 | 2,688 | 20.83 |
| 3B (embodiment) | 0.3 wt % | hydroxylamine (0.02 wt %) | 4-hydroxybenzoic acid (0.02 wt %) | 3 | 261 | 1,748 | 6.70 |
| 3C (embodiment) | 0.3 wt % | hydroxylamine (0.02 wt %) | 4-hydroxybenzoic acid (0.02 wt %) | 6 | 350 | 4,408 | 12.59 |
| 3D (embodiment) | 2 wt % | hydroxylamine (0.2 wt %) | 4-hydroxybenzoic acid (0.2 wt %) | 4.5 | 145 | 2,916 | 20.11 |
| 3E (embodiment) | 0.1 wt % | Hydroxylamine (0.007 wt %) | 4-hydroxybenzoic acid (0.007 wt %) | 4.5 | 337 | 3,948 | 11.72 |
| 3F (embodiment) | 0.02 wt % | Hydroxylamine (0.002 wt %) | 4-hydroxybenzoic acid (0.002 wt %) | 4.5 | 276 | 1,832 | 6.637 |
| 3G (embodiment) | 2 wt % | hydroxylamine (0.01 wt %) | salicylhydroxamic acid (0.2 wt %) | 4.5 | 418 | 7,540 | 18.04 |
| 3H (embodiment) | 0.3 wt % | hydroxylamine (0.02 wt %) | salicylhydroxamic acid (0.001 wt %) | 4.5 | 514 | 4,060 | 7.90 |

The comparison of embodiments 3B and 3C against embodiment 3A in Table 3 shows that the chemical mechanical polishing solution containing 0.02 wt % 4-hydroxybenzoic acid and 0.02 wt % hydroxylamine has the feature of the function of auto stop when the pH ranges from 3 to 6. The polishing solution of embodiment 3A performs better in polishing bump and blank rate at the pH value 4.5 than at pH value 3 and pH value 6.

The comparison of embodiments 3D, 3E against 3F with embodiment 3A in Table 3 shows that the chemical mechanical polishing solution has the feature of the function of auto stop when cerium oxide solid content ranges from 0.02 wt % to 2 wt %, hydroxylamine content ranges from 0.002 wt % to 0.2 wt % and 4-hydroxybenzoic acid content ranges from 0.002 wt % to 0.2 wt %.

The comparison of embodiments 3G and 3H against embodiment 3A in Table 3 shows that the polishing solution has the feature of the function of auto stop when the salicylhydroxamic acid content ranges from 0.001 wt % to 0.2 wt %.

According to the experiment results in the above embodiments 1-3 of this application, it can be concluded that:
1. The chemical mechanical polishing solution containing cerium oxide and hydroxylamine has the feature of the function of auto stop;
2. The chemical mechanical polishing solution containing cerium oxide, 4-hydroxybenzoic acid and hydroxylamine has the feature of the function of auto stop, and meanwhile can further improve the polishing rate of patterned wafer, and the polishing rate multiple of patterned/blank wafer is better when the pH value is 4.5;
3. The chemical mechanical polishing solution containing cerium oxide, salicylhydroxamic acid and hydroxylamine has the feature of the function of auto stop function, and can further improve the polishing rate of patterned wafers.

Although the above specific embodiments of the present invention have been described in detail, they are only examples, and the present disclosure is not limited to the embodiments described above. For those skilled in the art, any equivalent modification and substitution to the present invention is also covered in the present invention. Therefore, all these equivalent changes and modifications made without departing from the spirit and scope of the invention should be covered within the scope of the present invention.

The invention claimed is:

1. A chemical mechanical polishing solution formulated to provide an auto-stop function whereby a polishing rate on a blank wafer is less than a polishing rate on a patterned wafer, the chemical mechanical polishing solution consisting of water, cerium oxide, hydroxylamine, 4-hydroxybenzoic acid or salicylhydroxamic acid, and pH regulator, wherein a concentration of said cerium oxide is 0.01-2 wt %, wherein a concentration of hydroxylamine is 0.002 wt %-0.4 wt %, and wherein a pH of the chemical mechanical polishing solution ranges from 3 to 6.

2. The chemical mechanical polishing solution according to claim 1, wherein said pH regulator is selected from the group consisting of ammonia water, potassium hydroxide, nitric acid, sulfuric acid and acetic acid.

3. The chemical mechanical polishing solution according to claim 1, wherein a concentration of said 4-hydroxybenzoic acid is 0.002 wt %-0.2 wt %.

4. The chemical mechanical polishing solution according to claim 1, wherein a concentration of said salicylhydroxamic acid is 0.001 wt %-0.2 wt %.

* * * * *